United States Patent [19]
Dittmer

[11] Patent Number: 5,608,607
[45] Date of Patent: Mar. 4, 1997

[54] PCMCIA CARD AND ASSOCIATED SUPPORT AND CIRCUITRY AUGMENTING APPARATUS AND METHODS

[75] Inventor: Charles H. Dittmer, Houston, Tex.

[73] Assignee: Compaq Computer Corporation, Houston, Tex.

[21] Appl. No.: 427,575

[22] Filed: Apr. 24, 1995

[51] Int. Cl.$^6$ .............................. G06F 1/16; H05K 7/10
[52] U.S. Cl. .......................... 361/686; 361/737; 375/222
[58] Field of Search .................. 364/708.1; 375/222; 235/492; 381/87–91; 439/74, 76.1, 620, 638, 650, 651, 540.1, 928.1, 945, 946; D14/117; 361/684, 686, 737

[56] References Cited

U.S. PATENT DOCUMENTS

| | | | |
|---|---|---|---|
| 5,375,037 | 12/1994 | Le Roux | 361/684 |
| 5,391,094 | 2/1995 | Kakinoki et al. | 439/638 |
| 5,481,616 | 1/1996 | Freadman | 381/90 |

*Primary Examiner*—Michael W. Phillips
*Attorney, Agent, or Firm*—Konneker & Smith

[57] ABSTRACT

A PCMCIA card structure is operatively insertable into a dual PCMCIA card slot extending into the interior of a computer and comprises a PCMCIA card removably coupled to a circuitry augmenting and support structure that includes an attachment section and a support body portion. The attachment section is removably connectable to the outer end of the card, and the support body portion has a shape similar to that of the card, is secured to the attachment section, and is in a parallel, facing and closely adjacent relationship with the card. The attachment section forms an electrical interface connection between the PCMCIA card and an external device or system. Upon insertion of the PCMCIA card apparatus into the slot, side edge portions of the card and the support body portion are received in opposed channel member pairs within the slot, with the body portion bracing the attachment section. The support body portion may be permanently or removably secured to the attachment section, and may be a second PCMCIA card or a solid support structure. In a first embodiment of the PCMCIA card structure, the card is a modem card, and the attachment section has socket openings configured to receive a phone jack and a cellular phone connector plug. In a second embodiment the support body section is a second PCMCIA card. In a third embodiment the card has speaker phone capabilities, and the attachment section has mounted thereon a microphone, speaker, and headphone jacks.

18 Claims, 1 Drawing Sheet

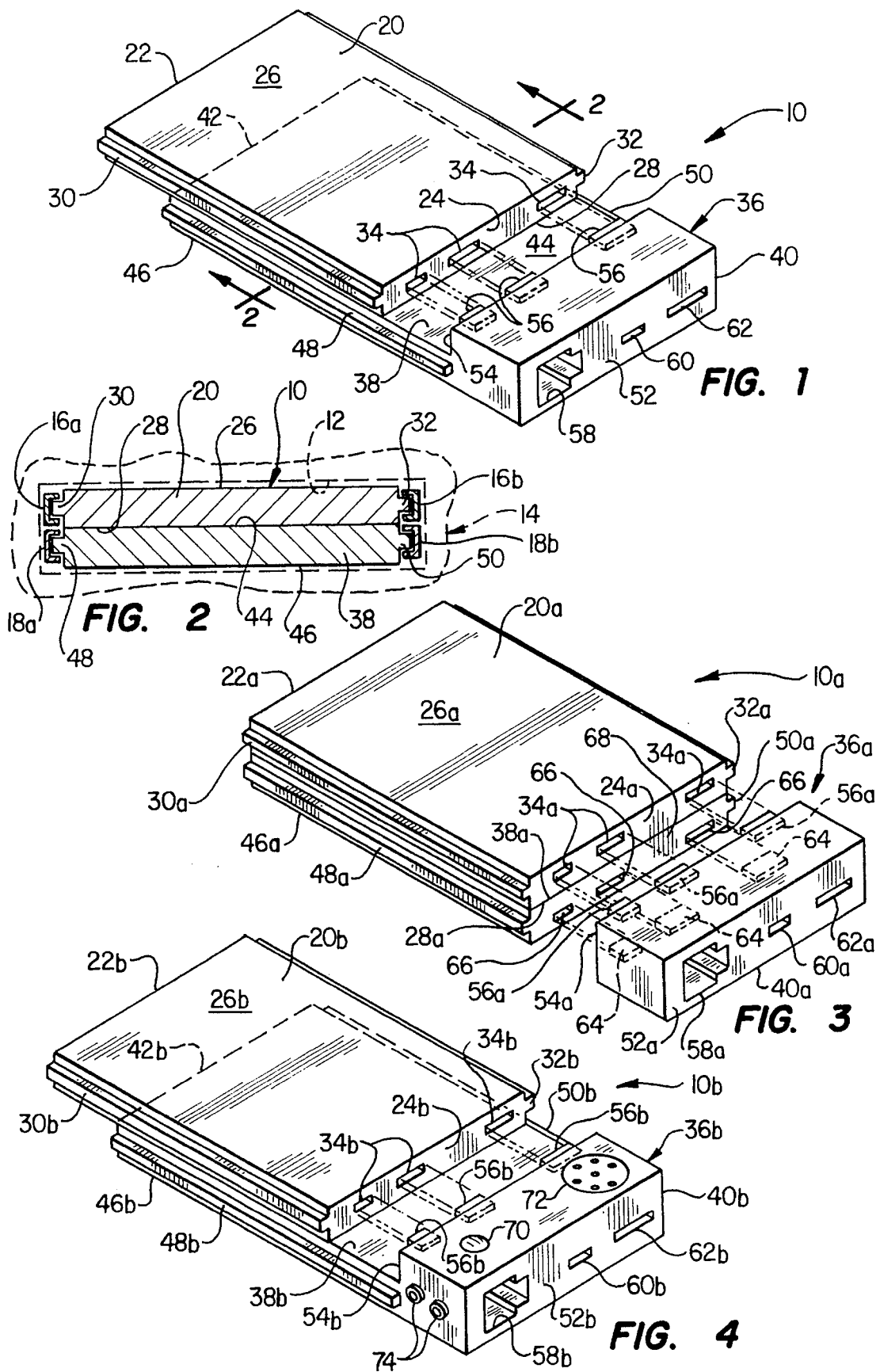

PCMCIA CARD AND ASSOCIATED SUPPORT AND CIRCUITRY AUGMENTING APPARATUS AND METHODS

BACKGROUND OF THE INVENTION

1. Field of the Invention

The present invention generally relates to computer apparatus, and more particularly relates to PCMCIA card structures that are removably insertable into the interior of a computer and operatively connectable to electronic circuitry therein.

2. Description of Related Art

Due to their small size, PCMCIA cards have recently become popular computer enhancement devices particularly in the realm of notebook computers. About the size of a credit card, a PCMCIA card is insertable lengthwise into a slot that extends inwardly into a computer housing. As the card is inserted into the slot its opposite side edge portions are received in a pair of opposed card side edge support channel structures, and when the card reaches its fully inserted orientation connector pins within the slot removably enter corresponding sockets in the inner card end to thereby electrically couple the internal card circuitry to the main circuitry within the computer.

Depending upon their internal circuitry, PCMCIA cards can augment the functions of their associated computer in a variety of ways serving, for example, as auxiliary memory cards, hard drives, pagers, network interface connectors and LAN cards. While the insertion of the typical PCMCIA card into its associated computer slot electrically couples the inserted card to the main computer circuitry, it is often necessary to also couple the card to an external device or system.

For example, when the PCMCIA card is a modem card it is necessary to couple the inserted card to an external phone system. This is typically accomplished using an adapter box that serves as an interface between the phone system and the modem card. The adapter box has a first cable extending outwardly therefrom with a connector on its outer end that is receivable in a wall-mounted phone jack outlet. A second cable also extends outwardly from the box and has a plug on its outer end that is insertable into corresponding socket openings on the outer end of the inserted PCMCIA card.

When the adapter box is operatively connected between the modem card and the phone system, the result is that a relatively large box is left dangling on a cable from the outer end of the inserted PCMCIA card—a result which is undesirable from both a mechanical connection standpoint and an aesthetic standpoint. It can thus be seen that it would be desirable to provide improved apparatus and methods for connecting an external system to a PCMCIA card such as a modem card. Accordingly, it is an object of the present invention to provide such improved apparatus and methods.

SUMMARY OF THE INVENTION

In carrying out principles of the present invention, in accordance with a preferred embodiment thereof, improved PCMCIA card apparatus is provided for use in conjunction with a dual PCMCIA card slot extending into the interior of a computer and having first and second pairs of opposing card edge support channel structures.

The PCMCIA card apparatus includes a PCMCIA card, representatively a modem card, having opposite side edge portions removably receivable in the first pair of card edge support channel structures, and a first end; and means for electrically coupling the PCMCIA card to a device external to the computer, the electrically coupling means including attachment means and support means.

The attachment means are removably connectable to the PCMCIA card end, and are additionally connectable to a device or system external to the computer and operable to provide an electrical interface between the PCMCIA card and the external device or system. The support means are operative to brace the attachment means relative to the PCMCIA card and include a support member having a shape similar to that of the PCMCIA card, an end secured to the attachment means, and opposite side edge portions configured and positioned to enter the second pair of opposed card edge support channel structures as the opposite PCMCIA card edge portions are being inserted into the first pair of card edge support channel structures.

According to other aspects of the invention, the attachment means are provided with socket means for receiving an RJ-11 phone jack and a pass-through cellular phone connector plug; the support member may be a second PCMCIA card either permanently or removably secured to the attachment means; and the primary PCMCIA card may be provided with speaker phone capabilities operative in conjunction with a speaker, microphone and audio head phone jacks mounted on the attachment means.

BRIEF DESCRIPTION OF THE DRAWINGS

FIG. 1 is an exploded, somewhat simplified perspective view of PCMCIA card apparatus embodying principles of the present invention;

FIG. 2 is an enlarged scale simplified cross-sectional view through the PCMCIA card apparatus illustrating its insertion into a dual PCMCIA card slot extending into the interior of a representative computer;

FIG. 3 is an exploded, somewhat simplified perspective view of a first alternate embodiment of the PCMCIA card apparatus; and FIG. 4 is an exploded, somewhat simplified perspective view of a second alternate embodiment of the PCMCIA card apparatus.

DETAILED DESCRIPTION

Perspectively illustrated in FIG. 1 is a computer card apparatus, representatively a PCMCIA card apparatus 10, that embodies principles of the present invention and is removably insertable into a dual PCMCIA computer card slot 12 (see FIG. 2) extending into a computer such as a notebook computer 14. Operatively positioned within the slot 12 are first and second pairs of horizontally opposing card edge support channel structures 16a, 16b and 18a, 18b.

Apparatus 10 includes a PCMCIA computer card 20 which is representatively a modem card and has inner and outer ends 22 and 24, top and bottom sides 26 and 28, and opposite side edges with outwardly projecting rail portions 30 and 32 that are receivable in the support channels 16a, 16b as shown in FIG. 2. Conventional sockets (not shown) are formed in the inner card end 22 and operatively receive corresponding pins (also not shown) that serve to electrically couple the inserted card 20 to the main circuitry within the computer 14. For purposes later described, a spaced plurality of sockets 34 are formed in the outer card end 24 and are operatively coupled to the circuitry within the card 20.

The PCMCIA card apparatus 10 also includes a circuitry augmenting and support structure 36 having a body portion 38 and an attachment section 40. Body portion 38 underlies and is shaped similarly to the PCMCIA card 20, having an inner end 42, top and bottom sides 44 and 46, and opposite side edges with outwardly projecting rail portions 48 and 50 thereon that are receivable in the support channels 18a, 18b as shown in FIG. 2.

The right or inner end of the body portion 38 is fixedly secured to the attachment section 40 which has a rectangular shape that is elongated in a direction transverse to the length of the body portion 38. Attachment section 40 has internal circuitry therein, an outer side surface 52 and an inner side surface 54 that projects upwardly beyond the top side 44 of the body portion 38 and faces toward its inner end 42. Projecting inwardly from the inner side surface 54 are a spaced plurality of connector plugs 56 that are removably insertable into the PCMCIA card sockets 34 to removably secure the circuitry augmenting and support structure 36 and the PCMCIA card 20 in an operating orientation and electrically couple the internal circuitry of the PCMCIA card 20 and the attachment section 40. With the structure 36 and the PCMCIA card 20 in their operating orientation, the PCMCIA card 20 is parallel to the body portion 38 in an aligned, closely adjacent facing relationship such that the assembled apparatus 10 may be operatively inserted into the card slot 12 as illustrated in FIG. 2.

Two socket means are formed on the outer side 52 of the attachment section 40—a socket opening 58 configured to releasably receive a standard RJ-11 phone jack (not shown), and a pair of socket openings 60, 62 configured to receive the prong portions of a standard pass-through cellular phone connector plug (not shown). According to a key aspect of the present invention, when the assembled PCMCIA card apparatus 10 is operatively inserted into the computer card slot 12, the attachment section 40 is braced relative to the PCMCIA card 20 by the body portion 38 which is, in turn, braced by the card edge support channel structures 18a, 18b. Accordingly, the usual external adapter box may be dispensed with, the internal circuitry of the attachment section 40 replacing the function of the usual external adapter box. Thus, only an appropriate cable need be interconnected from the socket 58 or the socket pair 60, 62 to an external system.

An alternate embodiment 10a of the previously described PCMCIA card apparatus 10 is illustrated in FIG. 3. For ease in comparison, the components of the apparatus 10a similar to those in apparatus 10 have been given identical reference numerals, but with the subscripts "a".

Apparatus 10a differs from apparatus 10 in that the body portion 38a of the circuitry augmenting and support structure 36a is a second PCMCIA card and is separable from the attachment section 40a by means of connector plugs 64 disposed on the attachment section inner side 54a and removably receivable in corresponding sockets 66 disposed on the outer end 68 of the second PCMCIA card 38a. PCMCIA card 38a has internal circuitry that, when the card is connected to the attachment section 40a, is coupled to the internal circuitry of the attachment section 40a. The body portion 38 shown in FIG. 1 may simply be a support member fixedly secured to the attachment section 40, or may be a separate PCMCIA card fixedly secured thereto. PCMCIA card apparatus 10a is insertable into the card slot 12 in the same manner as the apparatus 10 as indicated in FIG. 2.

A second alternate embodiment 10b of the previously described PCMCIA card apparatus 10 is illustrated in FIG. 4. For ease in comparison, the components of the apparatus 10b similar to those in apparatus 10 have been given identical reference numerals, but with the subscripts "b". Apparatus 10b is identical to the previously described apparatus 10 with the exceptions that the PCMCIA card 20b, via its internal electronic circuitry, has speaker phone capabilities, and the attachment section has operatively mounted thereon a microphone 70, a speaker 72, and a pair of headphone jacks 74. The PCMCIA card apparatus 10b, therefore, can be used to add speaker phone capability to a computer into which the apparatus 10b is inserted.

While the three representative embodiments 10, 10a, 10b of the PCMCIA card apparatus of the present invention have been illustrated as being built around PCMCIA modem cards 20, 20a, 20b it will be readily appreciated by those of skill in this particular art that the principles of the present invention, in which the circuitry augmenting and support structures 36, 36a, 36b are used as mechanical support and electrical interface means, could alternatively be used in conjunction with a wide variety of other types of PCMCIA cards if desired.

The foregoing detailed description is to be clearly understood as being given by way of illustration and example only, the spirit and scope of the present invention being limited solely by the appended claims.

What is claimed is:

1. Computer card apparatus removably insertable into a computer card slot having first and second pairs of opposed card edge support structures therein, said computer card apparatus comprising:

a computer card having first internal electronic circuitry, a first side surface, an inner end, and an outer end having first connector means thereon, and a pair of opposite side edge portions extending between said inner and outer ends and being removably insertable into the first pair of opposed card edge support structures; and a circuitry augmenting and support structure having a body portion with a shape similar to that of said computer card, a second side surface, a first end, a second end, a pair of opposite side edge portions extending between said first and second ends and being removable insertable into the second pair of opposed card edge support structures, an attachment section secured to said second end and having a first side portion projecting from said second side surface and facing toward said first end, second internal electronic circuitry disposed within said attachment section, and second connector means carried on said first side portion and being releasably mateable with said first connector means, and cooperative therewith to operatively interconnect said first and second electronic circuitry, when said first side portion is placed in a facing, closely adjacent relationship with said outer end of said computer card, said circuitry augmenting and support structure being releasably connectable to said computer card in an operating orientation in which said first and second connector means are releasably mated with said computer card and said circuitry augmenting device body portion being in a generally aligned relationship in which said first and second side surfaces face and are adjacent one another and said side edge portions of said computer card may be operatively inserted into the first pair of opposed card edge support structures in a manner causing said side edge portions of said body portion of said circuitry augmenting and support structure to enter the second pair of card edge support structures and cause said body portion to brace said attachment section against movement relative to said computer card.

2. The computer card apparatus of claim 1 wherein:

said computer card is a modem card, said attachment section has a second side portion, and said computer card apparatus further comprises socket means, disposed on said second side portion, for releasably receiving a phone connector device and operatively connecting the received phone connector device to said second electronic circuitry.

3. The computer card apparatus of claim 2 wherein:

said socket means are configured to releasably receive an RJ-11 phone jack.

4. The computer card apparatus of claim 2 wherein:

said socket means are configured to releasably receive a pass-through cellular phone connector.

5. The computer card apparatus of claim 2 wherein:

said modem card, via said first internal electronic circuitry, has speaker phone capability, and said attachment section has operatively mounted thereon and connected to said second internal electronic circuitry a microphone, a speaker, and audio ear phone jack sockets.

6. The computer card apparatus of claim 1 wherein:

said body portion of said circuitry augmenting and support structure is a second computer card.

7. The computer card apparatus of claim 1 wherein:

said body portion of said circuitry augmenting and support structure is removably securable to said attachment section.

8. The computer card apparatus of claim 7 wherein:

said body portion of said circuitry augmenting and support structure is a second computer card having third internal electronic circuitry coupled to said second internal electronic circuitry when said second computer card is secured to said attachment section.

9. A method of removably connecting a computer card to a computer having a computer slot disposed therein and including first and second pairs of opposed support structures, said computer card having first internal electronic circuitry therein, a first side surface, inner and outer ends, and a pair of opposite side edge portions extending between said inner and outer ends and receivable in said first pair of support channel structures when said computer card is inserted, inner end first, into said slot, said method comprising the steps of:

providing a circuitry augmenting and support structure having:
a body portion with a shape similar to that of said computer card, a second side surface, first and second ends, and side edge portions extending between said first and second ends, and
an attachment section secured to said second end and having second internal electronic circuitry and a first side portion projecting from said second side surface and facing toward said first end;

removably securing said attachment section to said outer end of said computer card in a manner such that said attachment section is in a parallel relationship with said computer card with said first and second side surfaces facing one another and said first internal electronic circuitry being coupled to said second internal electronic circuitry; and inserting said computer card apparatus into said computer card slot in a manner such that said side edge portions of said computer card and said body portion of said circuitry augmenting and support structure respectively enter and are supported in said first and second pairs of opposed support structures.

10. The method of claim 9 wherein:

said providing step is performed by the steps of providing said attachment section and removably securing an end of a second computer card thereto.

11. The method of claim 9 wherein:

said providing step includes the step of permanently securing said body portion to said attachment section.

12. For use in conjunction with a computer card slot extending into the interior of a computer and having first and second pairs of opposing card edge support structures, computer card apparatus operatively insertable into said slot and comprising:

a computer card having opposite side edge portions removably receivable in said first pair of card edge support structures, and a first end; and means for electrically coupling said computer card to a device external to the computer, including:
attachment means removably connectable to said end of said computer card, and additionally connectable to the device external to the computer, for providing an electrical interface between said computer card and the device, and
support means for bracing said attachment means relative to said computer card, said support means including a support member having a shape similar to that of said computer card, an end secured to said attachment means, and opposite side edge portions configured and positioned to enter said second pair of opposed card edge support structures as said opposite computer card edge portions are being inserted into said first pair of card edge support structures.

13. The computer card apparatus of claim 12 wherein:

said support means are defined by a second computer card, and said attachment means function to electrically couple the two computer cards.

14. The computer card apparatus of claim 13 wherein:

said second computer card is removably connected to said attachment means.

15. The computer card apparatus of claim 12 wherein:

said computer card is a modem card, and said computer card apparatus further comprises socket means, disposed on said attachment means, for releasably receiving a phone connector device and operatively connecting the received phone connector device to said computer card.

16. The computer card apparatus of claim 15 wherein:

said socket means are configured to releasably receive an RJ-11 phone jack.

17. The computer card apparatus of claim 15 wherein:

said socket means are configured to releasably receive a pass-through cellular phone connector.

18. The computer card apparatus of claim 15 wherein:

said modem card has speaker phone capability, and said attachment means have operatively mounted thereon and electrically coupled thereto microphone, a speaker, and audio ear phone jack sockets.

* * * * *